(12) United States Patent
Hatano et al.

(10) Patent No.: US 8,906,281 B2
(45) Date of Patent: Dec. 9, 2014

(54) IMPRINT METHOD, IMPRINTING EQUIPMENT, AND METHOD FOR MANUFACTURING SEMICONDUCTOR DEVICE

(75) Inventors: Masayuki Hatano, Kanagawa (JP); Takumi Ota, Kanagawa (JP); Yohko Furutono, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 290 days.

(21) Appl. No.: 13/402,244

(22) Filed: Feb. 22, 2012

(65) Prior Publication Data
US 2012/0244719 A1 Sep. 27, 2012

(30) Foreign Application Priority Data
Mar. 23, 2011 (JP) ................. 2011-064670

(51) Int. Cl.
*B29C 59/02* (2006.01)
*G03F 7/00* (2006.01)
(52) U.S. Cl.
CPC ..................... *G03F 7/002* (2013.01)
USPC ............. 264/293; 264/319; 425/385
(58) Field of Classification Search
USPC ................. 264/293, 319; 425/385
See application file for complete search history.

(56) References Cited

U.S. PATENT DOCUMENTS

| | | | | |
|---|---|---|---|---|
| 2007/0057397 A1* | 3/2007 | Duis et al. | ...... | 264/102 |
| 2011/0024948 A1* | 2/2011 | Takaya et al. | ...... | 264/293 |
| 2012/0009799 A1* | 1/2012 | Azuma et al. | ...... | 438/758 |

FOREIGN PATENT DOCUMENTS

| | | |
|---|---|---|
| JP | 2007-048367 | 2/2007 |
| JP | 2007-242134 | 9/2007 |
| JP | 2008-194980 | 8/2008 |
| JP | 2010-052173 | 3/2010 |
| JP | 2010-069730 | 4/2010 |
| JP | 2010-120316 | 6/2010 |
| JP | 2010-149482 | 7/2010 |

* cited by examiner

*Primary Examiner* — James Sanders
(74) *Attorney, Agent, or Firm* — Finnegan, Henderson, Farabow, Garrett & Dunner, L.L.P.

(57) ABSTRACT

In an imprint method according to one embodiment, a template on which a template pattern is formed is pushed against resist on a substrate to be transferred while the resist is cured in this state. The template is subsequently separated from the cured resist. The template is then degassed from the template pattern surface side between after the template is separated from the cured resist and till the template is pushed against resist at the next shot.

10 Claims, 9 Drawing Sheets

IMPRINT METHOD, IMPRINTING EQUIPMENT, AND METHOD FOR MANUFACTURING SEMICONDUCTOR DEVICE

CROSS-REFERENCE TO RELATED APPLICATIONS

This application is based upon and claims the benefit of priority from Japanese Patent Application No. 2011-064670, filed on Mar. 23, 2011; the entire contents of which are incorporated herein by reference.

FIELD

Embodiments described herein generally relate to an imprint method, imprinting equipment, and a method for manufacturing a semiconductor device.

BACKGROUND

Attention is being given to an imprint method where the pattern of an original plate (template) is transferred to a substrate to form a fine pattern with high productivity in manufacturing of electronic devices having fine structures such as MEMS (Micro Electro Mechanical System) devices and magnetic recording devices, semiconductor devices, and magnetic recording media.

In the imprint method, a template on which a pattern to be transferred has been formed is brought into contact with transfer material on a substrate to fill a recess of the template pattern with the transfer material. After the transfer material is cured, the template is separated from the substrate, so that the template pattern is transferred to the transfer material on the substrate.

In the conventional imprint method, a long time is required to fill a recess of a template pattern with transfer material without defects, which is an obstacle to the improvement of productivity. For example, a template has a problem that repeated imprinting gradually prolongs a filling time. Therefore, it is desired to fill the recess of the template pattern with the transfer material in a short time.

DETAILED DESCRIPTION

According to one embodiment, an imprint method is provided. Resist as transfer material is dropped to a substrate to be transferred where a template pattern formed on a template is transferred in the imprint method. The template is then pushed against the resist on the substrate to be transferred as well as the resist is cured in this state. The template is subsequently separated from the cured resist, so that the resist is patterned with a transfer pattern corresponding to the template pattern. The template is degassed from the template pattern surface side at a predetermined timing between after the template is separated from the cured resist and till the template is pushed against resist at the next shot.

Exemplary embodiments of an imprint method, imprinting equipment and a method for manufacturing a semiconductor device will be explained below in detail with reference to the accompanying drawings. The present invention is not limited to the following embodiments.

First Embodiment

Figure 1:
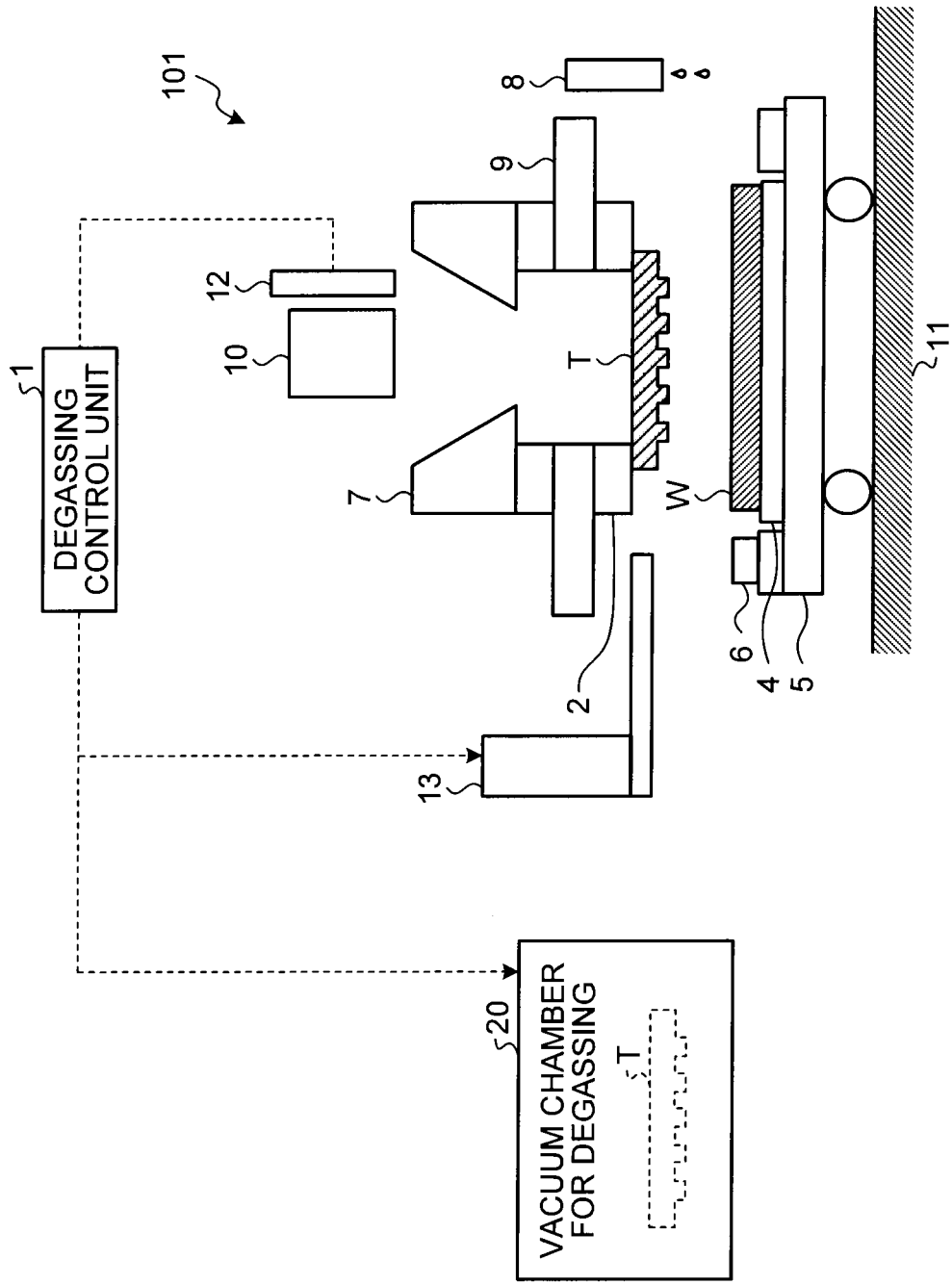
FIG. 1 is a view illustrating a configuration of imprinting equipment according to a first embodiment.

FIG. 1 is a view illustrating a configuration of imprinting equipment according to a first embodiment. Imprinting equipment 101 is equipment for transferring a template pattern (such as a circuit pattern) of an original plate (template) T to a substrate to be transferred (substrate to be processed) such as a wafer W. The imprinting equipment 101 of the embodiment transfers the template T into a vacuum chamber for degassing 20 to degas the template T if the number of imprints by the template T exceeds a predetermined specified number, for example. The template T herein is a quartz template, a glass template having gas permeability, or the like.

The imprinting equipment 101 includes a degassing control unit 1, an original plate stage 2, a substrate chuck 4, a sample stage 5, a reference mark 6, an alignment sensor 7, a liquid drop apparatus 8, a stage base 9, a UV light source 10, a stage surface plate 11, a CCD (Charge Coupled Device) camera 12, and an original plate transfer arm 13. The imprinting equipment 101 of the embodiment further includes the vacuum chamber for degassing 20 as a degassing unit.

The stage surface plate 11 has a principal plane in a horizontal direction, and the sample stage 5 moves on the principal plane. The sample stage 5 mounts the wafer W as well as moves within the flat surface (horizontal surface) in parallel with the mounted wafer W. The sample stage 5 moves the wafer W to the side below the liquid drop apparatus 8 when resist as transfer material is dropped on the wafer W, and moves the wafer W to the side below the template T when the imprint process is performed on the wafer W.

Moreover, the substrate chuck 4 is provided on the sample stage 5. The substrate chuck 4 fixes the wafer W to a predetermined position on the sample stage 5. Moreover, the reference mark 6 is provided on the sample stage 5. The reference mark 6 is a mark for detecting a position of the sample stage 5, and is used when the wafer W is loaded onto the sample stage 5.

The stage base 9 supports the template T and the like as well as pushes a template pattern of the template T against resist on the wafer W. The stage base 9 pushes the template T against the resist and separates (releases) the template T from the resist by moving in up and down directions (a vertical direction). Resist used for imprinting is a light-curing resin (light-curing agent), for example.

The original plate stage 2 is provided on the bottom side (wafer W side) of the stage base 9. The original plate stage 2 fixes the template T by vacuum adsorption or the like to a predetermined position from the backside (the surface of the side where the template pattern has not been formed) of the template T. Moreover, the alignment sensor 7 is provided on the stage base 9. The alignment sensor 7 is a sensor for detecting positions of the wafer W and the template T.

The liquid drop apparatus 8 is an apparatus for dropping resist on the wafer W. The UV light source 10 is a light source for applying UV light, and is provided above the stage base 9. The UV light source 10 applies UV light from above the template T in a state where the template T is being pushed against the resist.

The CCD camera 12 is a camera for imaging the resist while being filled in the template pattern of the template T via the substantially transparent template T. The CCD camera 12 is provided above the stage base 9. The CCD camera 12 sends a shot image to the degassing control unit 1.

The degassing control unit 1 calculates the size of an air bubble trapped in the resist (residual air bubble size) based on the image from the CCD camera 12. The degassing control unit 1 measures the time until the resist is filled in the recess (concave portion) of the template pattern (filling time) based on the elapsed property of the calculated residual air bubble size. The degassing control unit 1 measures the filling time of resist, setting, for example, a point when the residual air bubble size falls to a predetermined value and below, or a point when the change amount of the residual air bubble size falls to the predetermined value and below as the timing of filling completion. The degassing control unit 1 controls the original plate transfer arm 13 and the vacuum chamber for degassing 20 to degas the template T at a predetermined timing based on the measurement result of the filling time.

Incidentally, the degassing control unit 1 may control the original plate transfer arm 13 and the vacuum chamber for degassing 20 based on the number of imprints performed by the template T. In this case, the degassing control unit 1 counts the number of imprints performed by the template T. When the number of imprints performed by the template T has reached a specified number, the original plate transfer arm 13 and the vacuum chamber for degassing 20 are controlled to degas the template T.

The original plate transfer arm 13 is an arm for transferring the template T inside the imprinting equipment 101. The original plate transfer arm 13 transfers the template T that has been transferred from the outside of the imprinting equipment 101 to the position of the original plate stage 2. Moreover, the original plate transfer arm 13 of the embodiment transfers the template T into the vacuum chamber for degassing 20 from the original plate stage 2 at a predetermined timing (for example, when the filling time becomes longer than a predetermined value). The original plate transfer arm 13 transfers the template T into the vacuum chamber for degassing 20 in accordance with an instruction from the degassing control unit 1. Moreover, the original plate transfer arm 13 transfers the template T that has been degassed in the vacuum chamber for degassing 20 from the inside of the vacuum chamber for degassing 20 to the original plate stage 2.

The vacuum chamber for degassing 20 has a transfer inlet/outlet of the template T and walls for blocking outside air by closing the transfer inlet/outlet. The vacuum chamber for degassing 20 draws a vacuum from the interior surrounded by the walls in accordance with an instruction from the degassing control unit 1 to degas the template T that has been transferred into the interior. The vacuum chamber for degassing 20 degasses the template T from the template pattern surface side.

When the wafer W is imprinted, the wafer W mounted on the sample stage 5 is moved to directly below the liquid drop apparatus 8. Resist is then dropped on a predetermined shot position of the wafer W. The wafer W on the sample stage 5 is subsequently moved to directly below the template T. The template T is then pushed against the resist on the wafer W. Furthermore, the resist is cured in this state; accordingly, the resist on the wafer W is patterned with a transfer pattern corresponding to the template pattern.

By repeating the imprint process, the template T absorbs gas used during imprinting (such as helium) and gas that evolves during imprinting. Furthermore, the absorption of gas by the template T prolongs the filling time to fill the recess of the template pattern with resist. Therefore, in the embodiment, the vacuum chamber for degassing 20 degasses the template T at the predetermined timing based on the measurement result of the filling time obtained by the degassing control unit 1.

The imprinting equipment 101 causes the vacuum chamber for degassing 20 to degas the template T and then returns the template T to the original plate stage 2 to resume the imprint process. Incidentally, the timing of degassing the template T may be any timing other than during imprinting.

Figure 2:
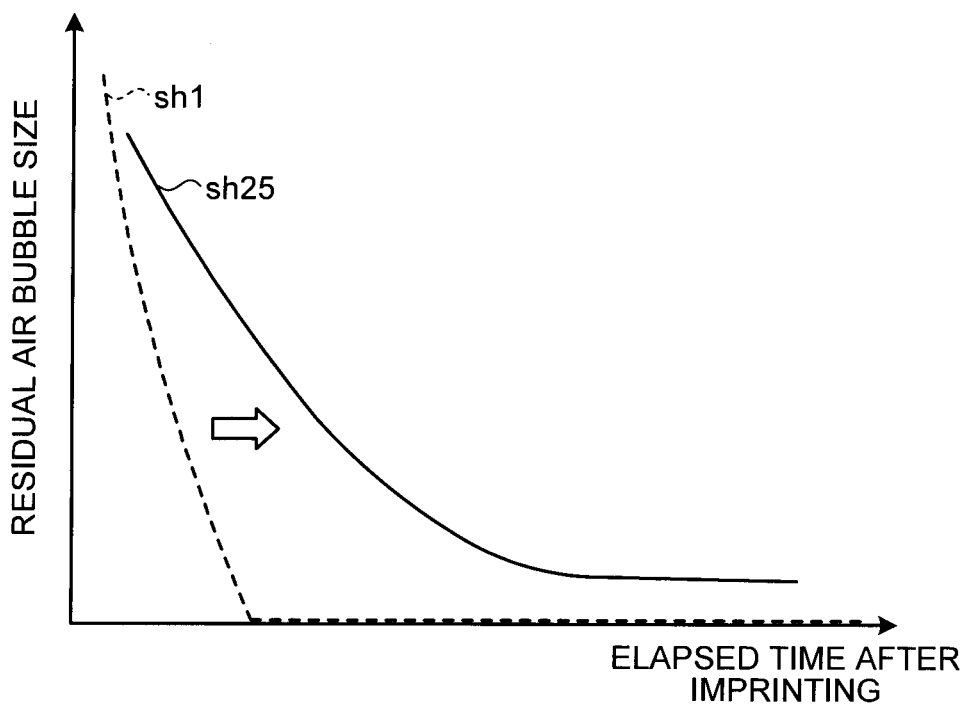
FIG. 2 is a view for explaining the relationship between a resist filling time and a residual air bubble size.

Here, a description will be given of the relationship between the resist filling time and the residual air bubble size. FIG. 2 is a view for explaining the relationship between the resist filling time and the residual air bubble size. In FIG. 2, the horizontal axis indicates a filling time after the template T is pushed against the resist (an elapsed time after imprinting), and the vertical axis indicates the residual air bubble size.

FIG. 2 is a graph illustrating the deterioration of the resist filling capability, and shows that an air bubble size property sh1 and an air bubble size property sh25 as the relationship between the resist filling time and the residual air bubble size. The air bubble size property sh1 is the elapsed property of an air bubble size of when resist is filled by use of the template T at the first shot. Moreover, the air bubble size property sh25 is the elapsed property of an air bubble size of when resist is filled by use of the template T at the 25th shot.

In the resist filling at the first shot, the residual air bubble size is reduced in a short time as shown in the air bubble size property sh1. On the other hand, in the resist filling at the 25th shot, a longer time is required than the resist filling at the first shot before the residual air bubble size is reduced as shown in the air bubble size property sh25.

In this manner, when resist is filled by use of the template T at a plurality of shots, as the number of times of resist filling increases, time necessary to reduce the residual air bubble size becomes longer. Therefore, in the embodiment, the template T is degassed from the template pattern surface side at a predetermined timing between after the template is separated from the resist and till the template T is pushed against resist at the next shot. Accordingly, the gas absorbed by the template T is released to the outside of the template T.

Figure 3:
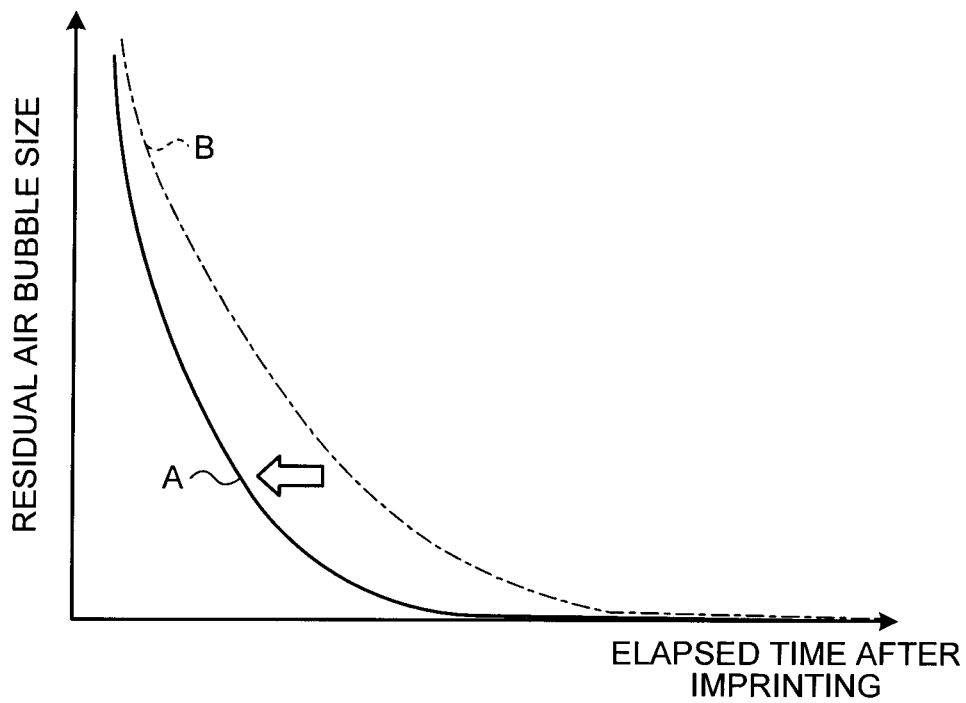
FIG. 3 is a view illustrating an example of the result of degassing a template.

FIG. 3 is a view illustrating an example of the result of degassing a template. In FIG. 3, the horizontal axis indicates a filling time after the template T is pushed against the resist (an elapsed time after imprinting), and the vertical axis indicates the residual air bubble size.

FIG. 3 is a graph illustrating the recovery of the resist filling capability, and shows an air bubble size property A and an air bubble size property B as the relationship between the resist filling time and the residual air bubble size. The air bubble size property B is the elapsed property of an air bubble size of when resist is filled by use of the template T that has absorbed a predetermined amount of gas. Moreover, the air bubble size property A is the elapsed property of an air bubble size of when resist is filled by use of a template T that has been degassed in the vacuum chamber for degassing 20 after the template T absorbed a predetermined amount of gas. In other words, the air bubble size property B is an air bubble size property before degassing, and the air bubble size property A is an air bubble size property A after degassing.

As shown in the air bubble size property B, in the case of before degassing, a long time is required to reduce the residual air bubble size. On the other hand, as shown in the air bubble size property A, in the case of after degassing, the residual air bubble size is reduced in a shorter time than the air bubble size property B before degassing.

In this manner, the degassing of the template T shortens time to reduce the residual air bubble size. Therefore, it is made possible to fill resist in the recess of the template pattern in a short time.

The template T is prepared for each layer of a wafer process, for example. When a semiconductor device (semiconductor integrated circuit) is manufactured, a film deposition process on the wafer W, an imprint process using the template T, a degassing process performed between the imprint processes, and a treatment process from over a resist pattern formed by the imprint process (such as an etching process) are repeated for each layer.

In this manner, according to the first embodiment, the vacuum chamber for degassing 20 degasses the template T at a predetermined timing, so that it is made possible to fill resist in the recess of the template pattern in a short time. Moreover, the template T is degassed from the template pattern surface side after imprinting; accordingly, it is made possible to carry out degassing in a short time.

Second Embodiment

Next, a description will be given of a second embodiment of the present invention with reference to FIGS. 4 and 5. In the second embodiment, a vacuum drawing unit 30 is provided on the sample stage 5 as a degassing unit instead of the vacuum chamber for degassing 20.

Figure 4:
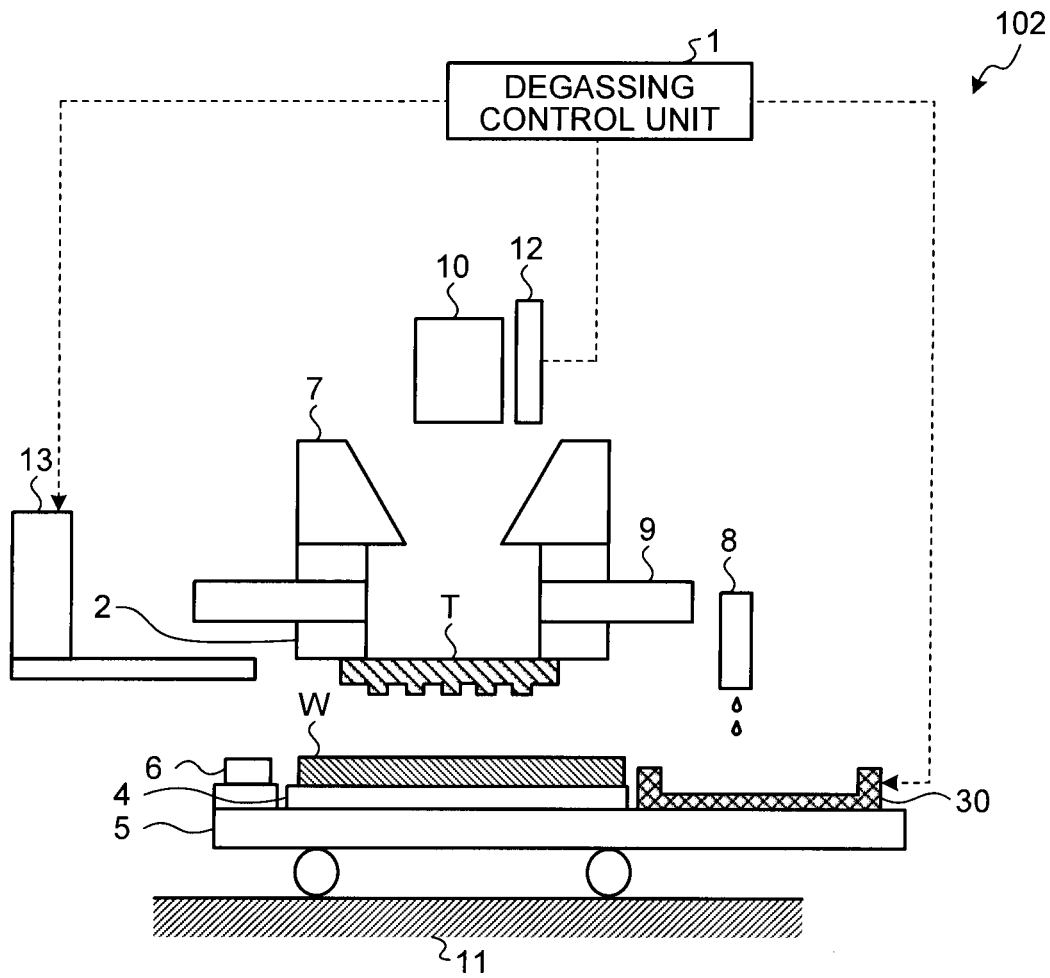
FIG. 4 is a view illustrating a configuration of imprinting equipment according to a second embodiment.

FIG. 4 is a view illustrating a configuration of imprinting equipment according to the second embodiment. The same numbers are assigned to the elements that achieve the same functions as the imprinting equipment 101 of the first embodiment shown in FIG. 1 among the elements in FIG. 4, and the overlapped description is omitted.

Imprinting equipment 102 includes the vacuum drawing unit 30 instead of the vacuum chamber for degassing 20. The vacuum drawing unit 30 is provided in a position different from a position where the wafer W is mounted on the sample stage 5. The template pattern surface side of the template T is mounted on the vacuum drawing unit 30. The vacuum drawing unit 30 degasses the template T by drawing a vacuum from the template T from the template pattern surface side.

Figure 5:
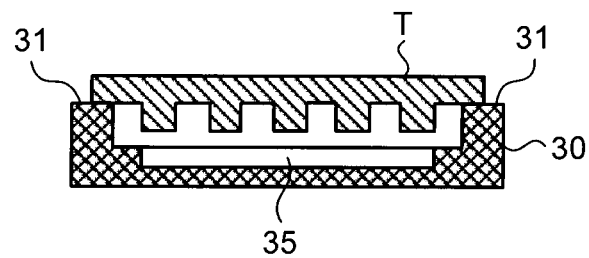
FIG. 5 is a view illustrating a configuration of a vacuum drawing unit.

FIG. 5 is a view illustrating a configuration of the vacuum drawing unit. A cross-sectional configuration of the vacuum drawing unit 30 is illustrated in FIG. 5. The vacuum drawing unit 30 has a mounting portion 31 for mounting the template T on a top surface side thereof. The mounting portion 31 is provided on the outer periphery of the vacuum drawing unit 30.

Moreover, a suction portion (vacuum drawing port) 35 having a roughly flat-shaped top surface is provided in the center of the vacuum drawing unit 30. The suction portion 35 is placed on the vacuum drawing unit 30 in a manner of being opposed to the template pattern when the template T is mounted on the mounting portion 31. The suction portion 35 sucks gas from the top surface side of the suction portion 35 to degas the template T.

The template pattern is formed on the center side of the template T, but the template pattern is not formed on the outer periphery thereof. Additionally, if the template pattern comes into contact with the vacuum drawing unit 30, the template pattern may be damaged. Accordingly, the vacuum drawing unit 30 is configured in a manner where the mounting portion 31 is higher than the suction portion 35 to prevent contact between the template pattern and the center of the vacuum drawing portion 30 (the suction portion 35) when the template T is mounted. Additionally, the outer periphery of the template T is mounted on the mounting portion 31 so that the template pattern does not come into contact with the vacuum drawing unit 30. The vacuum drawing unit 30 degasses the template T at a predetermined timing in accordance with an instruction from the degassing control unit 1.

In this manner, according to the second embodiment, the vacuum drawing unit 30 degasses the template T at a predetermined timing; accordingly, it is made possible to fill resist in the recess of the template pattern in a short time. Moreover, the template T is degassed from the template pattern surface side after imprinting; accordingly, it is made possible to carry out degassing in a short time.

Third Embodiment

Next, a description will be given of a third embodiment of the present invention with reference to FIGS. 6 and 7. In the third embodiment, a vacuum drawing head is provided on an original plate transfer arm as a degassing unit instead of the vacuum chamber for degassing 20 and the vacuum drawing unit 30.

Figure 6:
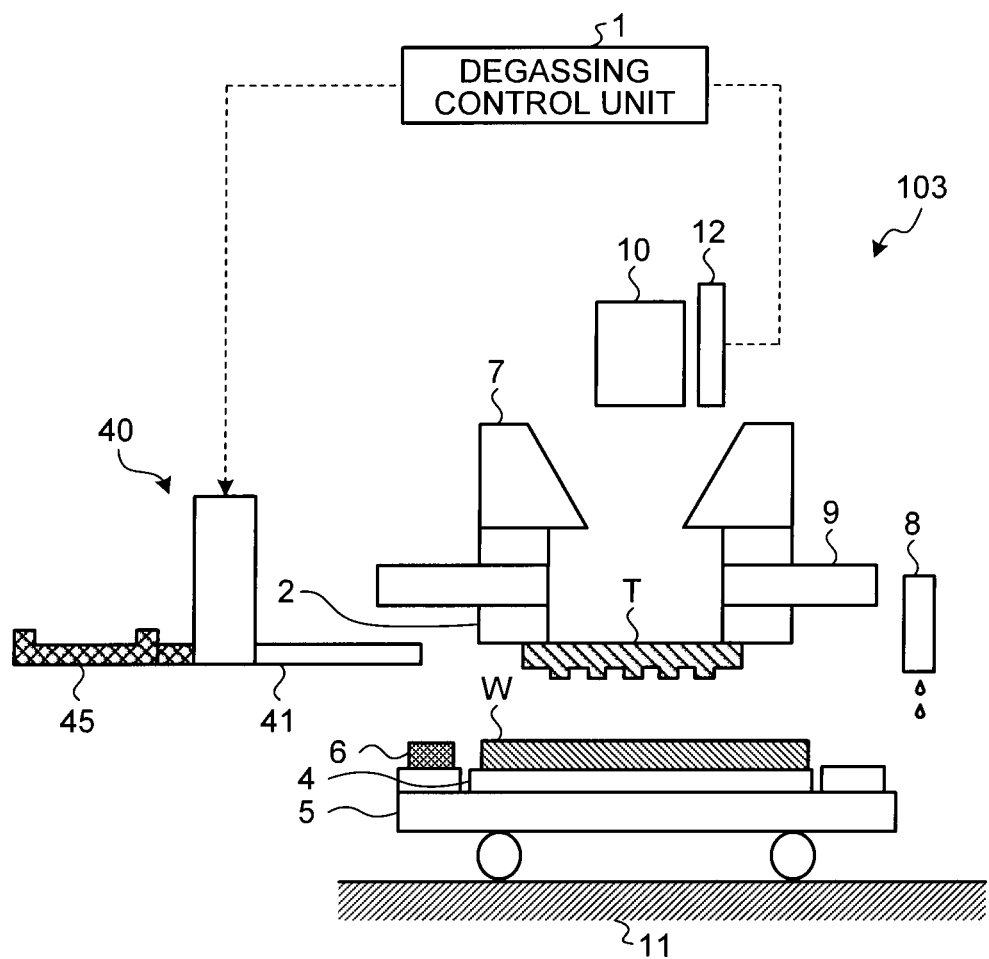
FIG. 6 is a view illustrating a configuration of imprinting equipment according to a third embodiment.

FIG. 6 is a view illustrating a configuration of imprinting equipment according to the third embodiment. The same numbers are assigned to the elements that achieve the same functions as the imprinting equipment 101 of the first embodiment shown in FIG. 1 among the elements in FIG. 6, and the overlapped description is omitted.

Imprinting equipment 103 includes an original plate transfer arm 40 instead of the original plate transfer arm 13. Additionally, the original plate transfer arm 40 includes a vacuum drawing head 45. Accordingly, the imprinting equipment 103 is configured to include the vacuum drawing head 45 instead of the vacuum chamber for degassing 20 and the vacuum drawing unit 30.

The vacuum drawing head 45 is provided on the original plate transfer arm 40 in a position different from a transfer head 41 for transferring the template T. The template pattern surface side of the template T is mounted on the vacuum drawing head 45. The vacuum drawing head 45 draws a vacuum from the template T from the template pattern surface side to degas the template T.

Figure 7:
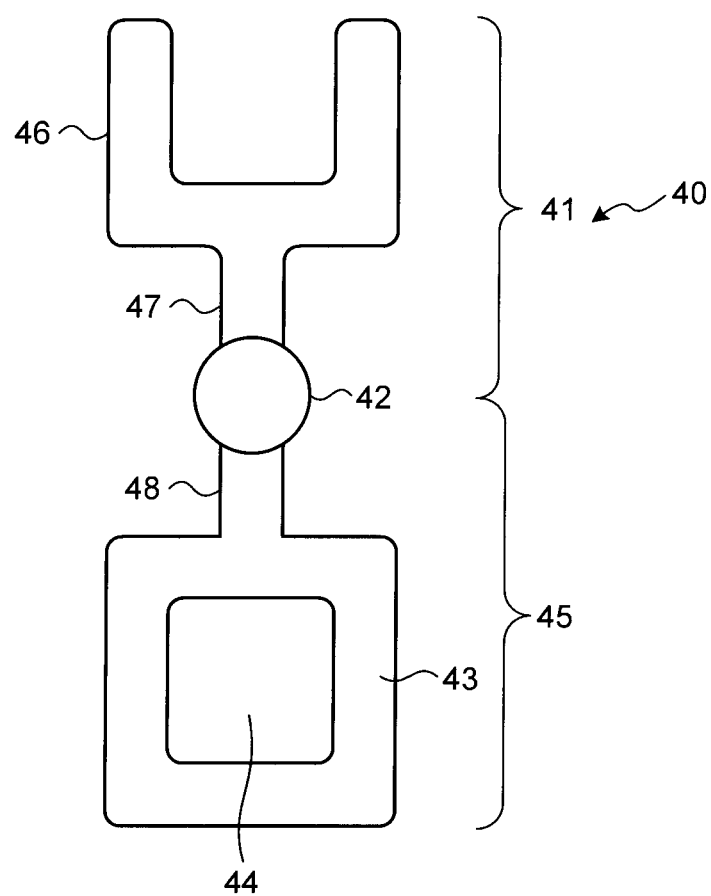
FIG. 7 is a view illustrating a configuration of an original plate transfer arm according to the third embodiment.

FIG. 7 is a view illustrating a configuration of the original plate transfer arm according to the third embodiment. FIG. 7 illustrates a top view of the original plate transfer arm 40. The original plate transfer arm 40 includes the transfer head 41 for transferring the template T and the vacuum drawing head 45 for degassing the template T. Additionally, on the original plate transfer arm 40, the transfer head 41 and the vacuum drawing head 45 are supported by a shaft portion 42 from the upper side. The original plate transfer arm 13 described in the first embodiment is configured of the transfer head 41 and the shaft portion 42, and the original plate transfer arm 40 of the embodiment is configured of the transfer head 41, the vacuum drawing head 45 and the shaft portion 42. The shaft portion 42 is freely rotatable around the center axis in a shaft direction of the shaft portion 42. The template T is mounted on the transfer head 41 when the template T is transferred, and the template T is mounted on the vacuum drawing head 45 when the template T is degassed.

The transfer head 41 has a substantially U-shaped and roughly flat-shaped template mounting portion 46 and a connection portion 47 for connecting the template mounting portion 46 with the shaft portion 42. With the configuration, the template pattern avoids contact with the transfer head 41.

The vacuum drawing head 45 has a substantially rectangular circular, and roughly flat-shaped mounting portion 43 and a connection portion 48 for connecting the mounting portion 43 with the shaft portion 42. Moreover, a suction portion (vacuum drawing port) 44 having a roughly flat-shaped top surface is provided in the center of the vacuum drawing head 45 (inside the mounting portion 43). The mounting portion 43 and the suction portion 44 have similar configurations to those of the mounting portion 31 and the suction portion 35, for example.

Specifically, the suction portion 44 is placed in a manner of being opposed to the template pattern when the template T is mounted on the vacuum drawing head 45. The suction portion 44 sucks gas from the top surface side to degas the template T.

The vacuum drawing head 45 is configured in a manner where the mounting portion 43 is higher than the suction portion 44 to prevent contact between the template pattern and the center of the vacuum drawing head 45 (the suction portion 44) when the template T is mounted. Additionally, the outer periphery of the template T is mounted on the mounting portion 43 so that the template pattern does not come into contact with the suction portion 44. The vacuum drawing portion 45 degasses the template T at a predetermined timing in accordance with an instruction from the degassing control unit 1.

With the configuration, the outer periphery of the template T is mounted on the template mounting portion 46 when the transfer head 41 transfers the template T. Moreover, the outer periphery of the template T is mounted on the mounting portion 43 when the vacuum drawing head 45 degasses the template T. Incidentally, the original plate transfer arm 40 may be configured of the vacuum drawing head 45 and the shaft portion 42. In this case, the template T is transferred by the vacuum drawing head 45.

In this manner, according to the third embodiment, the original plate transfer arm 40 (vacuum drawing head 45) degasses the template T at a predetermined timing; accordingly, it is made possible to fill resist in the recess of the template pattern in a short time. Moreover, the template T is degassed from the template pattern surface side after imprinting; accordingly, it is made possible to carry out degassing in a short time.

Fourth Embodiment

Next, a description will be given of a fourth embodiment of the present invention with reference to FIG. 8. In the fourth embodiment, when the number of imprints by the template T has reached a specified number, the template T is degassed.

Figure 8:
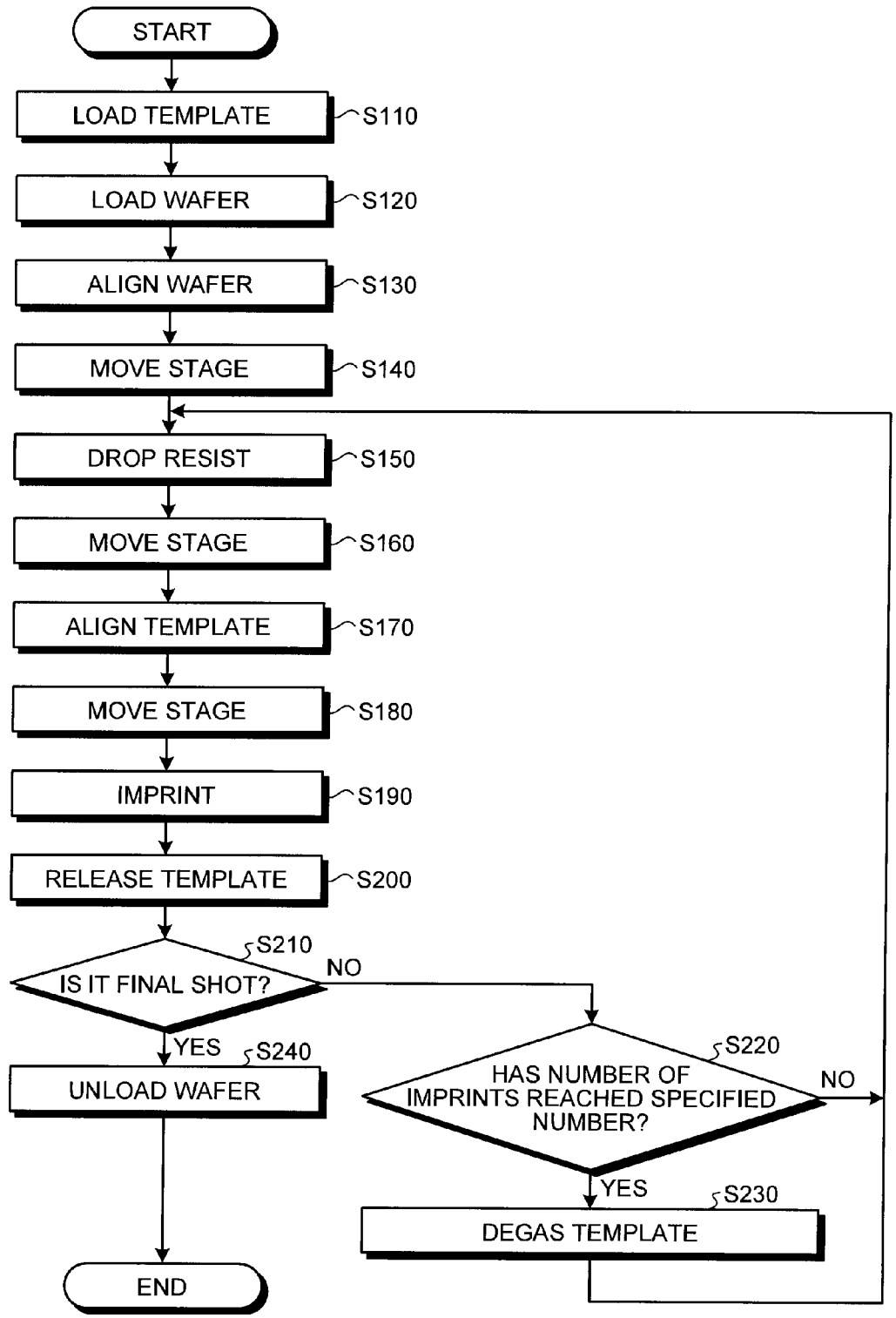
FIG. 8 is a flowchart illustrating processing procedures for an imprint process according to a fourth embodiment.

FIG. 8 is a flowchart illustrating processing procedures for an imprint process according to the fourth embodiment. Incidentally, any of the imprinting equipment 101 to 103 described in the first to third embodiments may be used for the imprint process according to the fourth embodiment. Here, a description will be given of procedures for an imprint process in the case of using the imprinting equipment 101.

The template T is loaded onto the original plate stage 2 in the imprinting equipment 101 (Step S110). Specifically, the template T is transferred by the original plate transfer arm 13 from the outside. The original plate transfer arm 13 then sets the template T on the original plate stage 2. Moreover, the wafer W is loaded onto the sample stage 5 in the imprinting equipment 101 (Step S120).

Wafer alignment being alignment of the wafer W (detection of the wafer W's position on the sample stage 5) is subsequently performed (Step S130). The wafer alignment here is rough alignment for checking a resist drop position. Specifically, the alignment sensor 7 reads the outline position of the wafer W, an alignment mark on the wafer W provided on the wafer W, and the like to perform alignment of the wafer W.

The sample stage 5 moves to the liquid drop apparatus 8 side based on the result of reading the position of the alignment mark on the wafer W to move the wafer W to the resist drop position (Step S140).

Resist is then dropped to an imprint target shot position on the wafer W from the liquid drop apparatus 8 (Step S150). When the drop of the resist is completed, the sample stage 5 moves to the original plate stage 2 side (Step S160).

Template alignment being alignment between the template T and the wafer W (detection of the positional relationship between the template T and the wafer W) is subsequently performed (Step S170). The template alignment here is fine alignment for checking an imprint position. Specifically, the alignment sensor 7 reads the position of an alignment mark on the template provided on the template T to perform the template alignment.

Incidentally, if the alignment mark on the template is not provided on the template T, it is assumed that the position of the template T supported by the original plate stage 2 is fixed (invariant) position, and the positional relationship between the template T and the wafer W is detected. Moreover, the wafer alignment and the template alignment may be performed by use of the CCD camera 12 instead of the alignment sensor 7.

The sample stage 5 moves to the imprint position based on the result of reading the position of the alignment mark on the wafer W and the result of reading the position of the alignment mark on the template to move the wafer W to the imprint position (Step S180).

A predetermined shot of the wafer W is subsequently imprinted (Step S190). Specifically, the original plate stage 2 descends, so that the template T moves to the imprint position on the wafer W. Accordingly, the template T is pushed against the resist in the imprint position. The UV light from the UV light source 10 is then applied from above the template T in a state where the template T is being pushed against the resist. Accordingly, the resist is cured, and the template pattern (concavo-convex pattern) is transferred onto the wafer W. The original plate stage 2 ascends subsequently, so that the template T is released (separated) from the resist (Step S200).

After the completion of imprinting, the degassing control unit 1 adds one to the count of the number of imprints performed by the template T. The degassing control unit 1 then judges whether or not the imprinted shot is the final shot of the wafer W (Step S210). If the imprinted shot is not the final shot of the wafer W (Step S210, No), the degassing control unit 1 judges whether or not the number of imprints (the number of imprint shots) using the template T has reached a specified number (Step S220). The specified number here is set based on the number of imprints where concentrations of gas in the template T are saturated, for example.

If the number of imprints using the template T has not reached the specified number (Step S220, No), imprinting is performed for the next shot. Specifically, the processes of Steps S150 to S210 are performed.

Additionally, if the imprinted shot is not the final shot of the wafer W (Step S210, No), the degassing control unit 1 judges whether or not the number of imprints using the template T has reached the specified number (Step S220).

If the number of imprints using the template T has reached the specified number (Step S220, Yes), the degassing control unit 1 causes the vacuum chamber for degassing 20 described in the first embodiment to degas the template T (Step S230). At this time, the original plate transfer arm 13 unloads the template T from the original plate stage 2 to load the template T into the vacuum chamber for degassing 20. A vacuum is subsequently drawn from the inside of the vacuum chamber for degassing 20, so that the template T is degassed. Accordingly, the filling capability (air bubble release) of resist into the template T is recovered.

Incidentally, the degassing process for the template T may be performed by the vacuum drawing unit 30 described in the second embodiment, for example. In this case, the original plate transfer arm 13 unloads the template T from the original plate stage 2 to load the template T onto the vacuum drawing unit 30. The suction portion 35 subsequently draws a vacuum, so that the template T is degassed.

Moreover, the degassing process for the template T may be performed by the original plate transfer arm 40 described in the third embodiment, for example. In this case, the original plate transfer arm 40 causes the vacuum drawing head 45 to unload the template T from the original plate stage 2. The suction portion 44 then draws a vacuum, so that the template T is degassed.

The template T that has been degassed by any of the vacuum chamber for degassing 20, the vacuum drawing unit 30 and the original plate transfer arm 40 is subsequently loaded onto the original plate stage 2 by the original plate transfer arm 13 or the original plate transfer arm 40.

After the template T is degassed, the degassing control unit 1 resets the count of the number of imprints performed by the template T. In the imprinting equipment 101, the processes of Steps S150 to S220 or the processes of Steps S150 to S230 are then repeated until an imprint at the final shot is completed. If the imprinted shot is the final shot of the wafer W (Step S210, Yes), the original plate transfer arm 13 unloads the template T from the original plate stage 2 to transfer the template T out of the imprinting equipment 101 (Step S240). The next wafer W is subsequently loaded into the imprinting equipment 101, and the processes of Steps S120 to S240 are performed.

Incidentally, any of the template T and the wafer W may be loaded first. Moreover, the template T and the wafer W may be loaded at the same time. Moreover, the template T may be degassed while resist is dropped on the wafer W. In other words, when the process of Step S230 is performed, the processes of Steps 230 and S150 may be performed at the same time.

Moreover, when the original plate transfer arm 13 unloads the template T from the original plate stage 2, the degassing control unit 1 may judge whether or not the number of imprints using the template T has reached the specified number. In this case, if the number of imprints using the template T has reached the specified number, the imprinting equipment 101 may degas the template T while unloading the wafer W.

In this manner, according to the fourth embodiment, the template T is degassed when the number of imprints using the template T has reached the specified number, so that it is possible to prevent the filling time from becoming a long time. Therefore, even if imprinting is performed at a plurality of shots, it is made possible to fill resist in a short time at each shot. As a result, it is made possible to efficiently perform imprinting with high productivity where there is less deterioration in throughput.

Fifth Embodiment

Next, a description will be given of a fifth embodiment of the present invention with reference to FIG. 9. In the fifth embodiment, when the filling time of resist upon imprinting becomes longer than a specified time, the template T is degassed.

Figure 9:
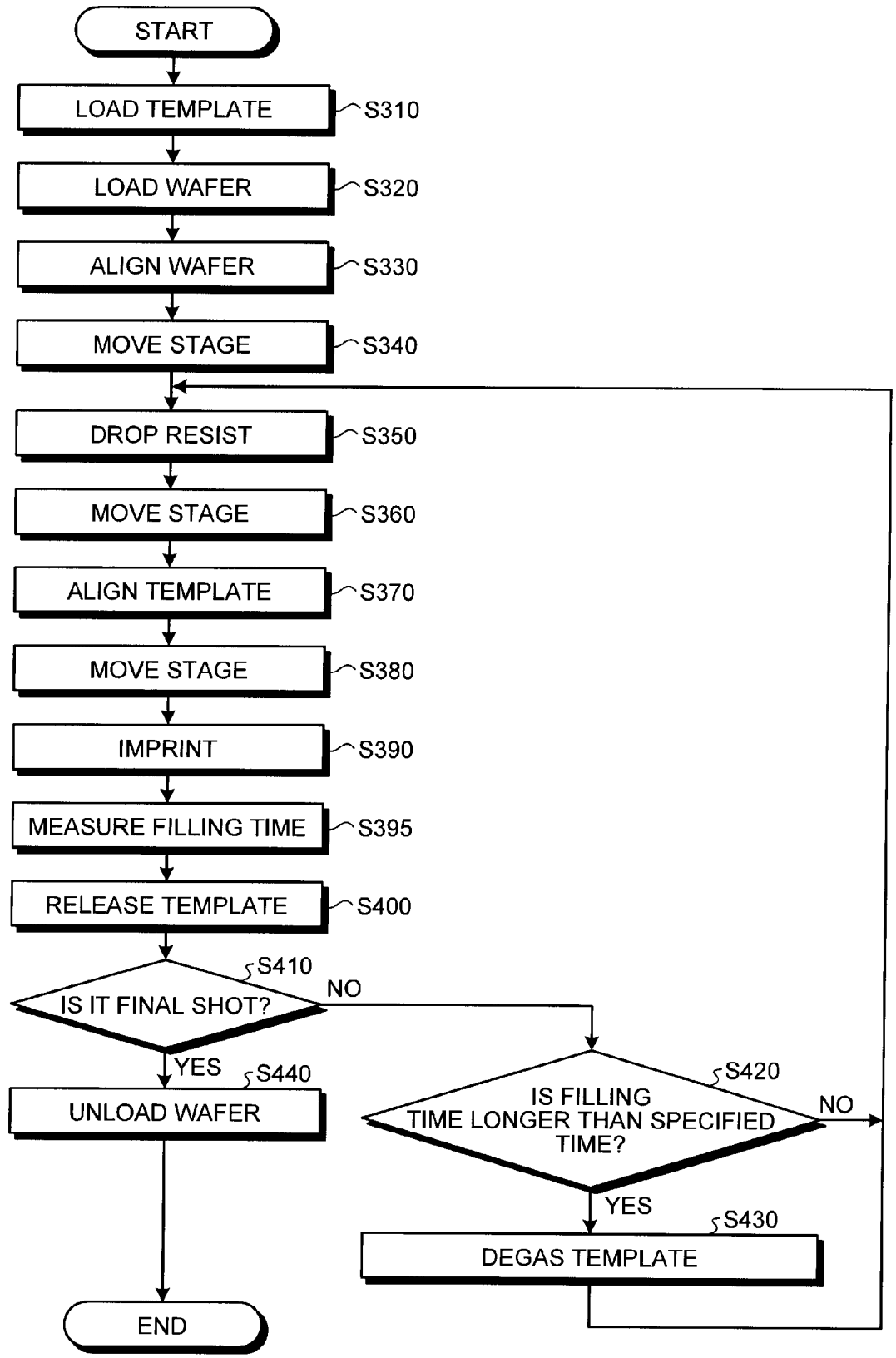
FIG. 9 is a flowchart illustrating processing procedures for an imprint process according to a fifth embodiment.

FIG. 9 is a flowchart illustrating processing procedures for an imprint process according to the fifth embodiment. Incidentally, in the processing procedures for the imprint process shown in FIG. 9, the description of processing procedures similar to the processing procedures for the imprint process shown in FIG. 8 is omitted. Moreover, the imprint process according to the fifth embodiment may use any of the imprinting equipment 101 to 103 described in the first to third embodiments. Here, a description will be given of procedures for an imprint process in the case of using the imprinting equipment 101.

In the imprinting equipment 101, processing similar to the processing of FIG. 8 described in the fourth embodiment is performed from the loading of the template T to the imprint process (imprinting) of the wafer W. In other words, the processes of Steps S310 to S390 shown in FIG. 9 are processes similar to those of Steps S110 to S190 shown in FIG. 8, respectively.

In the imprinting equipment 101, the UV light from the UV light source 10 is applied from above the template T in a state where the template T is being pushed against the resist, so that the resist is cured, and the template pattern is transferred onto the wafer W (Step S390).

Upon the imprint process, the CCD camera 12 images resist that is being filled in the template pattern via the substantially transparent template T. Moreover, upon the imprint process, the degassing control unit 1 calculates the size of an air bubble of resist (a residual air bubble size) based on the image from the CCD camera 12. The degassing control unit 1 measures the time until resist is filled in the recess of the template pattern (filling time) based on the calculated residual air bubble size. The degassing control unit 1 measures the filling time of resist, setting, for example, a point when the residual air bubble size falls to a predetermined value and below, or a point when the change amount of the residual air bubble size falls to the predetermined value and below as the timing of the filling completion (Step S395).

After the resist is cured, the original plate stage 2 ascends, so that the template T is released from the resist (Step S400). The degassing control unit 1 then judges whether or not the imprinted shot is the final shot of the wafer W (Step S410). If the imprinted shot is not the final shot of the wafer W (Step S410, No), the degassing control unit 1 judges whether or not the filling time of the resist upon imprinting (measurement result) is longer than a specified time (Step S420).

If the filling time of the resist is shorter than the specified time (Step S420, No), imprinting is performed for the next shot. Specifically, the processes of Steps S350 to S410 are performed.

Moreover, if the imprinted shot is not the final shot of the wafer W (Step S410, No), the degassing control unit 1 judges whether or not the filling time of the resist upon imprinting is longer than the specified time (Step S420).

If the filling time of the resist upon imprinting is longer than the specified time (Step S420, Yes), the degassing control unit 1 causes the vacuum chamber for degassing 20 to degas the template T (Step S430). The degassing process for the template T is a process similar to the process of S230 described in FIG. 8.

The template T that has been degassed by any of the vacuum chamber for degassing 20, the vacuum drawing unit 30 and the original plate transfer arm 40 is subsequently loaded onto the original plate stage 2 by the original plate transfer arm 13 or the original plate transfer arm 40.

After the template T is degassed, the processes of Steps S350 to S420 or the processes of Steps S350 to S430 are repeated until an imprint at the final shot is completed in the imprinting equipment 101. If the imprinted shot is the final shot of the wafer W (Step S410, Yes), the original plate transfer arm 13 unloads the template T from the original plate stage 2 to transfer the template T out of the imprinting equipment 101 (Step S440). The next wafer W is subsequently loaded into the imprinting equipment 101, and the processes of Steps S320 to S440 are performed.

Incidentally, when the original plate transfer arm 13 unloads the template T from the original plate stage 2, the degassing control unit 1 may judge whether or not the filling time of the resist upon imprinting is longer than the specified time. In this case, if the filling time of the resist upon imprinting is longer than the specified time, the imprinting equipment 101 may degas the template T while unloading the wafer W.

In this manner, according to the fifth embodiment, if the filling time of the resist upon imprinting becomes longer than the specified time, the template T is degassed, so that it is possible to prevent the filling time from becoming a long time. Therefore, even if imprinting is performed at a plurality of shots, it is made possible to fill resist in a short time at each shot. As a result, it is made possible to efficiently perform imprinting with high productivity where there is less deterioration in throughput.

Sixth Embodiment

Next, a description will be given of a sixth embodiment of the present invention with reference to FIG. 10. In the sixth embodiment, when the wafer W is unloaded, the template T is degassed.

Figure 10:
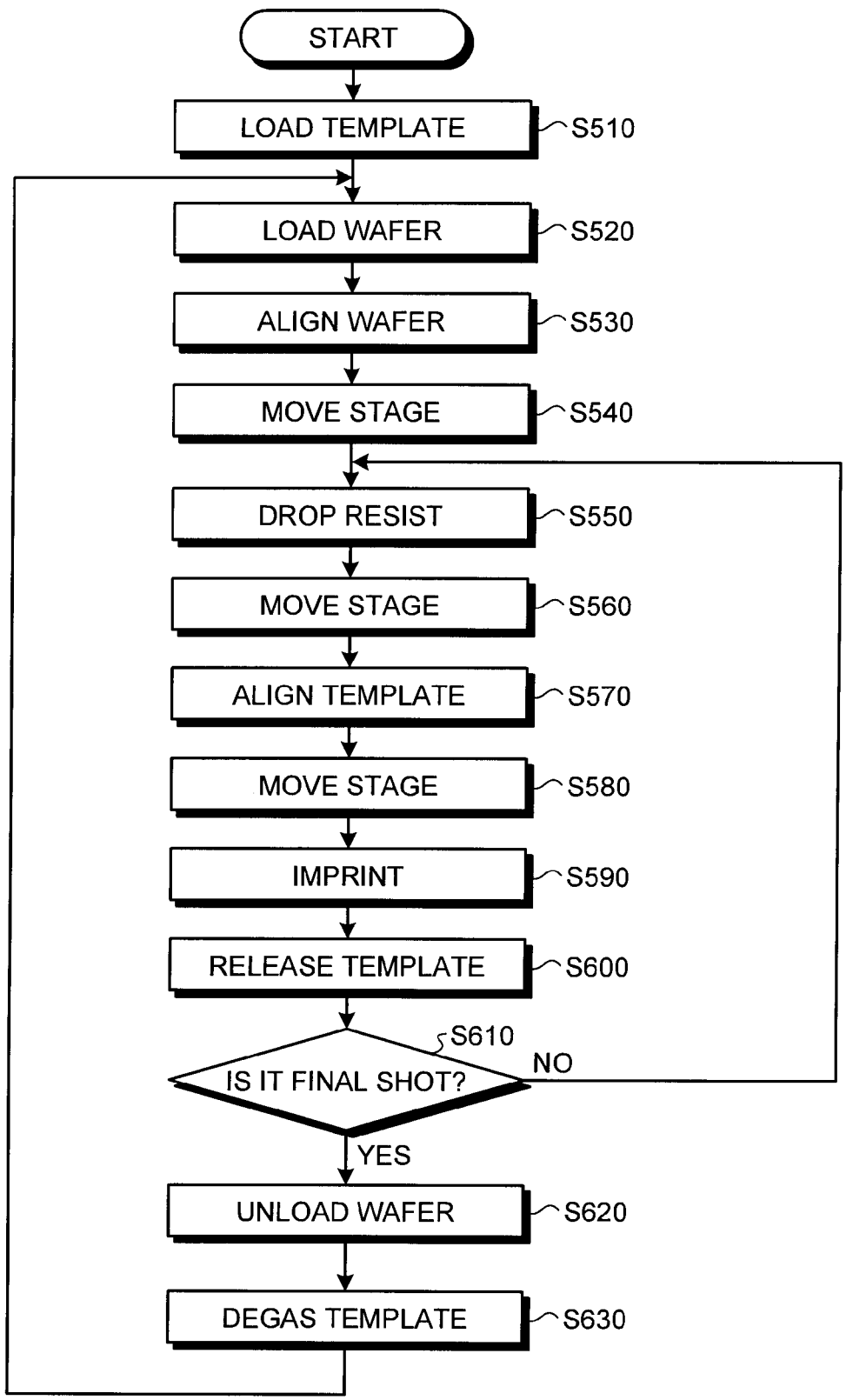
FIG. 10 is a flowchart illustrating processing procedures for an imprint process according to a sixth embodiment.

FIG. 10 is a flowchart illustrating processing procedures for an imprint process according to the sixth embodiment. Incidentally, in the processing procedures for the imprint process shown in FIG. 10, the description of processing procedures similar to the processing procedures for the imprint process shown in FIG. 8 is omitted. Moreover, the imprint process according to the sixth embodiment may use any of the imprinting equipment 101 to 103 described in the first to third embodiments. Here, a description will be given of procedures for an imprint process in the case of using the imprinting equipment 101.

In the imprinting equipment 101, processing similar to the processing of FIG. 8 described in the fourth embodiment is performed from the loading of the template T to the release of the template T. In other words, the processes of Steps S510 to S600 shown in FIG. 10 are processes similar to those of Steps S110 to S200 shown in FIG. 8, respectively.

After the template T is released from the resist, the degassing control unit 1 judges whether or not the imprinted shot is the final shot of the wafer W in the imprinting equipment 101 (Step S610). If the imprinted shot is not the final shot of the wafer W (Step S610, No), imprinting is performed for the next shot. Specifically, the processes of Steps S550 to S610 are performed.

On the other hand, if the imprinted shot is the final shot of the wafer W (Step S610, Yes), the original plate transfer arm 13 unloads the template T from the original plate stage 2 to transfer the template T out of the imprinting equipment 101 (Step S620). At this time, the degassing control unit 1 causes the vacuum chamber for degassing 20 to degas the template T (Step S630). The degassing process for the template T is a process similar to the process of Step S230 described in FIG. 8.

The next wafer W is subsequently loaded into the imprinting equipment 101, and the processes of Steps S520 to S610 are performed. In the imprinting equipment 101, the wafers W are imprinted in turn by repeating the processes of Steps S520 to S630.

Incidentally, in the embodiment, the description has been given of the case where the template T is degassed when the wafer W is unloaded, but the template T may be degassed when the wafer W is loaded. Moreover, the template T may be degassed when the wafer W is unloaded and loaded. Moreover, the template T may be degassed upon the wafer alignment (Step S530).

In this manner, according to the sixth embodiment, the template T is degassed when the wafer W is unloaded, so that it is made possible to degas the template T efficiently. In other words, the operations other than degassing are performed in parallel with the degassing operation, so that it is made possible to avoid a decrease in productivity due to the degassing process. Therefore, it is made possible to perform imprinting efficiently.

Seventh Embodiment

Next, a description will be given of a seventh embodiment of the present invention with reference to FIG. 11. In the seventh embodiment, when resist is dropped on the wafer W, the template T is degassed.

Figure 11:
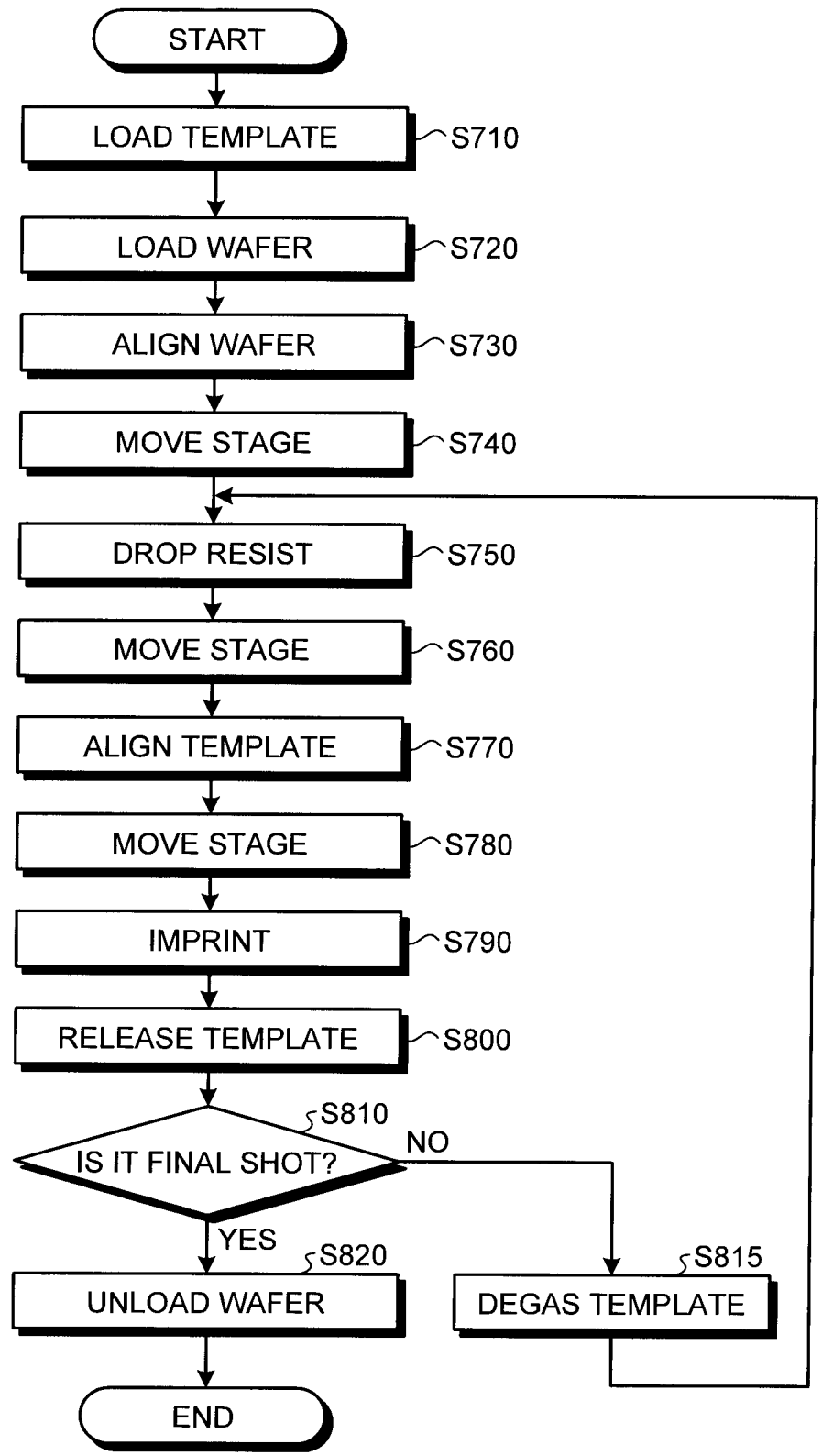
FIG. 11 is a flowchart illustrating processing procedures for an imprint process according to a seventh embodiment.

FIG. 11 is a flowchart illustrating processing procedures for an imprint process according to the seventh embodiment. Incidentally, in the processing procedures for the imprint process shown in FIG. 11, the description of processing procedures similar to the processing procedures for the imprint process shown in FIG. 8 is omitted. Moreover, the imprint process according to the seventh embodiment may use the imprinting equipment 103 described in the third embodiment, for example.

In the imprinting equipment 103, processing similar to the processing of FIG. 8 described in the fourth embodiment is performed from the loading of the template T to the release of the template T. In other words, the processes of Steps S710 to S800 shown in FIG. 11 are processes similar to those of Steps S110 to S200 shown in FIG. 8, respectively.

After the template T is released from the resist, the degassing control unit 1 judges whether or not the imprinted shot is the final shot of the wafer W in the imprinting equipment 103 (Step S810). If the imprinted shot is not the final shot of the wafer W (Step S610, No), imprinting is performed for the next shot. Specifically, the processes of Steps S750 to S810 are performed. Upon these processes, the imprinting equipment 103 drops resist on the wafer W (Step S750) while degassing the template T (Step S815), in the embodiment.

Specifically, when resist is dropped on the wafer W, the degassing control unit 1 causes the vacuum drawing head 45 to degas the template T. The degassing process for the template T is a process similar to the process of Step S230 described in FIG. 8. Incidentally, the vacuum drawing head 45 may degas the template T in a state where the template T is being supported by the original plate stage 2. The processes of Steps S760 to S810 are subsequently performed.

If the imprinted shot is the final shot of the wafer W (Step S810, Yes), the original plate transfer arm 13 unloads the template T from the original plate stage 2 to transfer the template T out of the imprinting equipment 103 (Step S820).

Incidentally, in the embodiment, the template T is set to be degassed if the imprinted shot is not the final shot of the wafer W; however, the degassing of the template T upon dropping resist on the wafer W may be performed at a rate of once for predetermined shots.

In this manner, according to the seventh embodiment, the template T is degassed when resist is dropped on the wafer W, so that it is made possible to degas the template T efficiently. In other words, the operations other than degassing are performed in parallel with the degassing operation, so that it is made possible to avoid a decrease in productivity due to the degassing process. Therefore, it is made possible to perform imprinting efficiently.

Incidentally, the imprint methods (degassing methods) described in the first to seventh embodiments may be combined. In this manner, according to the first to seventh embodiments, it is made possible to fill resist being transfer material in a recess of a template pattern in a short time. Therefore, it is made possible to perform imprinting efficiently.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An imprint method comprising:
   dropping resist as transfer material to a substrate to be transferred where a template pattern formed on a template is transferred;
   pushing the template against the resist on the substrate to be transferred while curing the resist in that state, and subsequently separating the template from the cured resist, thereby patterning the resist with a transfer pattern corresponding to the template pattern; and
   degassing the template from the template pattern surface side at a predetermined timing between after the template is separated from the cured resist and till the template is pushed against resist at a next shot;
   wherein upon time necessary to fill the resist in a recess of the template pattern becoming longer than a specified time, the template is degassed.

2. The imprint method according to claim 1, wherein upon patterning on the resist by use of the template exceeding a specified number of times, the template is degassed.

3. The imprint method according to claim 1, wherein the template is degassed by a vacuum being drawn therefrom in a vacuum chamber surrounded by predetermined walls.

4. The imprint method according to claim 1, wherein
   the substrate to be transferred is mounted on a substrate mounting unit upon patterning the resist with the transfer pattern, and
   the template is degassed by a vacuum being drawn therefrom on the substrate mounting unit.

5. The imprint method according to claim 1, wherein
   the template is transferred by a transfer arm onto the substrate to be transferred, and
   the template is degassed by a vacuum being drawn therefrom on the transfer arm.

6. A method for manufacturing a semiconductor device, comprising:
   dropping resist as transfer material to a substrate to be transferred where a template pattern formed on a template is transferred;
   pushing the template against the resist on the substrate to be transferred while curing the resist in that state, and subsequently separating the template from the cured resist to pattern the resist with a transfer pattern corresponding to the template pattern;
   degassing the template from the template pattern surface side at a predetermined timing between after the template is separated from the cured resist and till the template is pushed against resist at a next shot; and
   processing the substrate to be transferred from over the transfer pattern and accordingly forming a pattern on the substrate corresponding to the transfer pattern on the substrate to be transferred;
   wherein upon time necessary to fill the resist in a recess of the template pattern becoming longer than a specified time, the template is degassed.

7. The method for manufacturing a semiconductor device according to claim 6, wherein upon patterning on the resist by use of the template exceeding a specified number of times, the template is degassed.

8. The method for manufacturing a semiconductor device according to claim 6, wherein the template is degassed by a vacuum being drawn therefrom in a vacuum chamber surrounded by predetermined walls.

9. The method for manufacturing a semiconductor device according to claim 6, wherein
   the substrate to be transferred is mounted on a substrate mounting unit upon patterning the resist with the transfer pattern, and
   the template is degassed by a vacuum being drawn therefrom on the substrate mounting unit.

10. The method for manufacturing a semiconductor device according to claim 6, wherein
    the template is transferred by a transfer arm onto the substrate to be transferred, and
    the template is degassed by a vacuum being drawn therefrom on the transfer arm.

* * * * *